United States Patent [19]
Hayashi et al.

[11] Patent Number: 5,663,945
[45] Date of Patent: Sep. 2, 1997

[54] DIGITAL PHASE LOCKED LOOP WITH A DIGITAL VOLTAGE CONTROLLED OSCILLATOR IN A RECORDING INFORMATION REPRODUCING APPARATUS

[75] Inventors: Hideki Hayashi; Masaru Umezawa, both of Tsurugashima, Japan

[73] Assignee: Pioneer Electronic Corporation, Tokyo, Japan

[21] Appl. No.: 571,241

[22] Filed: Dec. 12, 1995

[30] Foreign Application Priority Data

Dec. 13, 1994 [JP] Japan .................. 6-308954

[51] Int. Cl.⁶ .................. H03L 7/08; G11B 7/00
[52] U.S. Cl. .................. 369/124; 369/59; 369/54; 369/48; 360/46; 360/51; 375/376
[58] Field of Search .................. 369/124, 48, 54, 369/59; 375/376, 371; 360/46, 51

[56] References Cited

U.S. PATENT DOCUMENTS

| | | | |
|---|---|---|---|
| 4,975,930 | 12/1990 | Shaw | 375/120 |
| 5,424,882 | 6/1995 | Kazawa | 360/46 |
| 5,469,415 | 11/1995 | Fujita et al. | 369/59 |
| 5,475,715 | 12/1995 | Hase et al. | 375/354 |
| 5,521,767 | 5/1996 | Weng et al. | 375/290 |
| 5,553,104 | 9/1996 | Takashi et al. | 375/373 |

FOREIGN PATENT DOCUMENTS 6-060553  3/1994  Japan ............. G11B 20/14

*Primary Examiner*—Georgia Y. Epps
*Assistant Examiner*—Kim-Kwok Chu
*Attorney, Agent, or Firm*—Sughrue, Mion, Zinn, Macpeak & Seas

[57] ABSTRACT

A digital PLL circuit in a recording information reproducing apparatus, wherein a sampled value is obtained by A/D converting a read signal read from a recording medium at a sampling timing according to a reproduction clock signal, a phase error occurring in the read signal is detected on the basis of the sampled value, an oscillation data signal sequence whose data value increases or decreases at a changing period corresponding to the phase error is generated, the oscillation data signal sequence is converted to an analog signal, an oscillation signal is formed, and a signal obtained by converting the oscillation signal to a square wave is set to a reproduction clock signal for sampling.

6 Claims, 10 Drawing Sheets

SAW-TOOTH WAVE SPECTRUM

TRIANGULAR WAVE SPECTRUM

SINE WAVE SPECTRUM

SAW-TOOTH STAIRWAY WAVE SPECTRUM p : fo−fs = 3fs
q : fo−2fs = 2fs
r : fo−3fs = fs
s : fo−4fs = 0
t : |fo−5fs| = fs

TRIANGULAR STAIRWAY WAVE SPECTRUM p : fo−fs = 3fs
q : fo−3fs = fs
r : |fo−5fs| = fs

SINE STAIRWAY WAVE SPECTRUM

P : fo−fs = 3f

DIGITAL PHASE LOCKED LOOP WITH A DIGITAL VOLTAGE CONTROLLED OSCILLATOR IN A RECORDING INFORMATION REPRODUCING APPARATUS

BACKGROUND OF THE INVENTION

1. Field of the Invention

The present invention relates to a PLL (Phase Locked Loop) circuit in an apparatus for reproducing information recorded on a recording medium.

2. Description of the Related Background Art

A Viterbi decoding (Viterbi Algorithm) is known as a method whereby recording information recorded on a recording medium at a high density is decoded with high reliability. In the Viterbi decoding, a read signal read from the recording medium is not judged as a binary of "1" or "0" on the basis of a predetermined threshold value but sampling values obtained by sampling the read signal are handled as a continuous time sequence and a data train which seems to be certain is obtained on the basis of the time sequence. In a recording information reproducing apparatus using the Viterbi decoding, sampling data sampled by a reproduction clock signal having a predetermined relative phase which follows to a time base fluctuation of the read signal is needed.

FIG. 1 is a diagram showing an example of a construction of the recording information reproducing apparatus using the Viterbi decoding.

In FIG. 1, a recording disk 3 on which information has been recorded is rotated by a spindle motor 2. A pickup 1 reads the recorded information on the recording disk 3 and generates a read signal to supply it to a head amplifier 4. The head amplifier 4 supplies an amplified read signal obtained by properly amplifying the supplied read signal to each of an A/D converter 5 and a sync detecting circuit 6. The sync detecting circuit 6 detects a sync signal from the amplified read signal, generates a sync detection signal at the time point of the detection, and supplies the sync detection signal to a spindle servo circuit 7. A frequency dividing circuit 8 generates a reference frequency dividing clock signal obtained by dividing a reference clock signal having a predetermined frequency supplied from a reference clock generating circuit 9 to a specified frequency of the sync signal and supplies the reference frequency dividing clock signal to the spindle servo circuit 7. The spindle servo circuit 7 obtains a frequency difference between the frequency of the reference frequency dividing clock signal and the frequency of the sync detection signal and supplies it as a frequency error signal to the spindle motor 2. The spindle servo circuit 7 further obtains a phase difference between the phase of the reference frequency dividing clock signal and the phase of the sync detection signal and supplies it as a phase error signal to the spindle motor 2. The spindle motor 2 rotates the recording disk 3 at a rotational speed based on the frequency error signal and the phase error signal.

The A/D converter 5 sequentially converts the amplified read signal amplified by the head amplifier 4 to a sampled value at a timing of a reproduction clock signal supplied from a PLL circuit 10 and supplies the sampled value to each of the PLL circuit 10 and a time base correcting circuit 20.

The time base correcting circuit 20 is constructed by, for example, a FIFO (First-In First-Out) memory. The circuit 20 sequentially writes the sampled value supplied from the A/D converter 5 at a timing of the reproduction clock signal, further sequentially reads the sampled value at a timing of the reference clock signal, and supplies it to a Viterbi decoder 30. A time base fluctuation component in association with the rotation of the recording disk 3 is eliminated by the operation of the time base correcting circuit 20. The Viterbi decoder 30 handles the sampled value whose time base was corrected by the time base correcting circuit 20 as a continuous time sequence and obtains reproduced data which seems to be certain on the basis of the time sequence.

A phase detecting circuit 11 in the PLL circuit 10 detects the phase error occurring in the read signal on the basis of a sampled value sequence which is sequentially supplied from the A/D converter 5 and supplies the phase error signal corresponding to the phase error component to a D/A converter 12. The D/A converter 12 supplies a phase error voltage value obtained by converting the phase error signal to a voltage value corresponding to the phase error signal to an LPF (low pass filter) 13. The LPF 13 supplies an average phase error voltage value obtained by averaging the phase error voltage values to a VCO (voltage controlled oscillator) 14. The VCO 14 generates a clock signal having an oscillating frequency corresponding to the average phase error voltage value and supplies the clock signal as a reproduction clock signal to each of the A/D converter 5 and the time base correcting circuit 20.

As mentioned above, the reproduction clock signal whose frequency changes so as to correct the phase error occurring in the read signal can be obtained by the PLL circuit 10. The A/D converter 5, therefore, can sequentially generate the sampling value at a timing having a fixed relative phase which follows the time base fluctuation of the read signal.

In the PLL circuit 10, however, since the VCO with an analog circuit construction for generating the clock signal of an oscillating frequency corresponding to an input voltage value is used, the circuit is easily influenced by a fluctuation of a power source voltage, an ambient temperature, an aging change in characteristics, and the like, so that there is a problem such that stable loop characteristics cannot be obtained. Since the VCO with the analog circuit construction has errors and a variation of circuit element values, further, there is a problem such that it is necessary to adjust the oscillating frequency.

SUMMARY OF THE INVENTION

The present invention is made to solve the problems and it is an object of the invention to provide a digital PLL circuit which can generate a reproduction clock signal that is accurately synchronized with a phase of a read signal by obtaining stable loop characteristics.

According to the present invention, there is provided a digital PLL circuit in a recording information reproducing apparatus having an A/D converter for sampling a read signal read from a recording medium at a timing according to a reproduction clock signal, thereby sequentially obtaining the sampled value, and decoding means for obtaining reproduction data on the basis of the sampled value, wherein the digital PLL circuit includes: phase detecting means for obtaining a phase error data signal corresponding to a phase error occurring in the read signal on the basis of the sampled value; a digital VCO for generating an oscillation data signal sequence whose data value increases or decreases at a changing period according to the phase error data signal; a D/A converter for converting the oscillation data signal sequence into an analog signal, thereby obtaining an oscillation signal; and clock signal forming means for obtaining a signal obtained by converting a signal waveform of the oscillation signal to a square wave as the reproduction clock signal.

In the digital PLL circuit according to the present invention, the read signal read from the recording medium is A/D converted to the sampled value at a sampling timing corresponding to the reproduction clock signal, a phase error occurring in the read signal is detected on the basis of the sampling value, the oscillation data signal sequence whose data value is increased or decreased at a changing period corresponding to the phase error is generated, and the oscillation data signal sequence is converted to an analog signal, thereby obtaining the oscillation signal. The signal obtained by converting the waveform of the oscillation signal to the square wave is output as the reproduction clock signal for sampling.

DETAILED DESCRIPTION OF THE PREFERRED EMBODIMENTS

An embodiment of the present invention will now be described hereinbelow.

Figure 1:
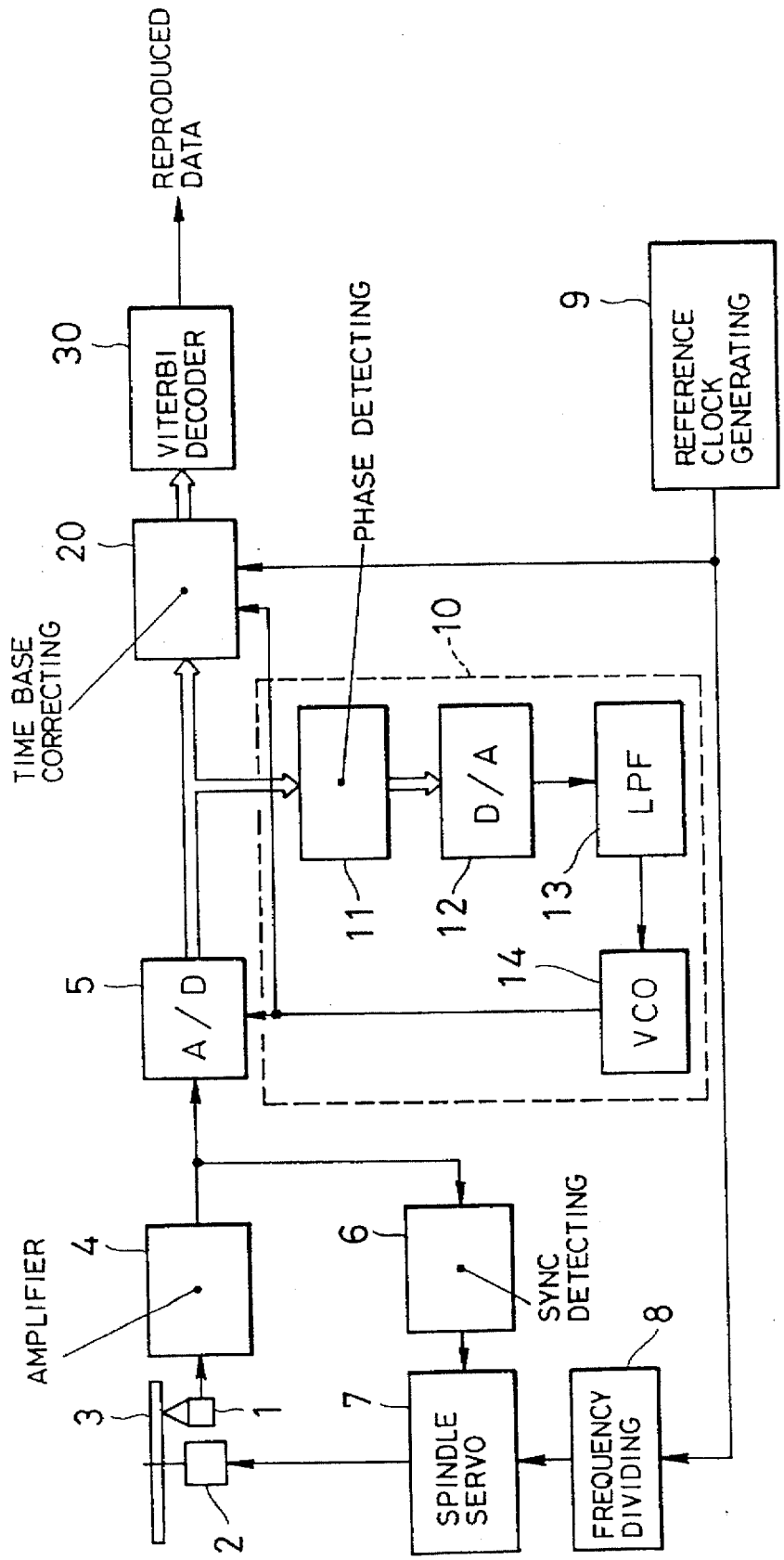
FIG. 1 is a diagram showing an example of a construction of conventional recording information reproducing apparatus.
Figure 2:
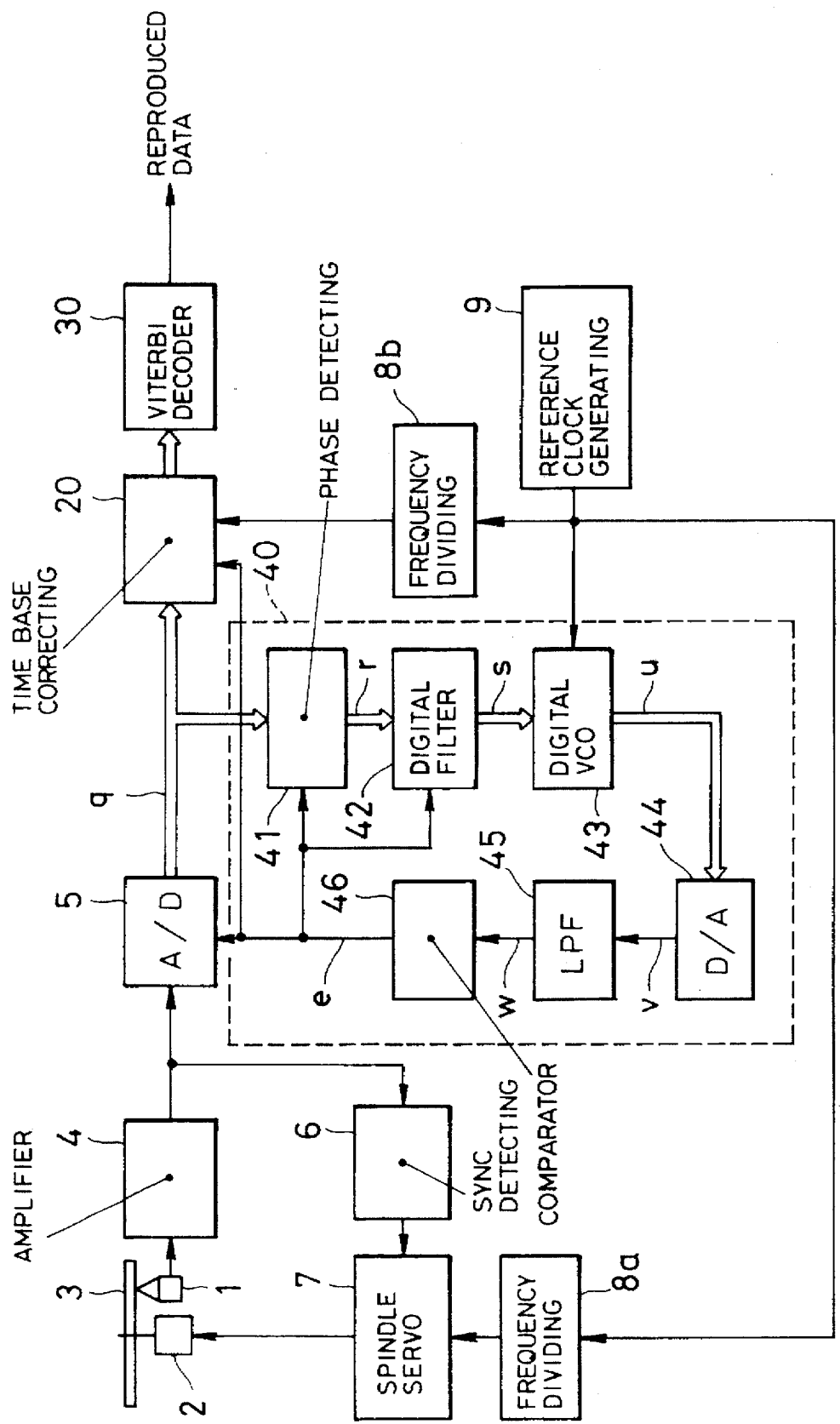
FIG. 2 is a diagram showing a construction of the recording information reproducing apparatus having a digital PLL circuit according to the invention.

FIG. 2 is a diagram showing a construction of a recording information reproducing apparatus having a digital PLL circuit 40 according to the invention.

In FIG. 2, the pickup 1 reads recording information recorded on the recording disk 3 which is rotated by the spindle motor 2 and supplies the read signal to the head amplifier 4. The head amplifier 4 supplies an amplified read signal obtained by properly amplifying the supplied read signal to each of the A/D converter 5 and the sync detecting circuit 6. The sync detecting circuit 6 detects a sync signal from the amplified read signal, and generates a sync detection signal and supplies it to the spindle servo circuit 7 when the sync signal is detected. A frequency dividing circuit 8a generates a reference frequency dividing clock signal obtained by dividing the reference clock signal with a predetermined frequency supplied from the reference clock generating circuit 9 to a specified frequency of the sync signal and supplies the generated signal to the spindle servo circuit 7. The spindle servo circuit 7 obtains a frequency difference between the frequency of the reference frequency dividing clock signal and the frequency of the sync detection signal and supplies it as a frequency error signal to the spindle motor 2. The spindle servo circuit 7 further obtains a phase difference between the phase of the reference frequency clock signal and the phase of the sync detection signal and supplies it as a phase error signal to the spindle motor 2. The spindle motor 2 rotates the recording disk 3 at a rotational speed based on the frequency error signal and the phase error signal.

The A/D converter 5 sequentially converts the read signal amplified by the head amplifier 4 to a sampled value q at a timing of a reproduction clock signal e supplied from the digital PLL circuit 40 and supplies it to each of the digital PLL circuit 40 and the time base correcting circuit 20. When considering a recording and reproducing system as a partial response transmitting system, an ideal desired value to which the sampled value q obtained by the A/D converter 5 can be set is equal to any one of three values "0", "1", and "2", for example.

The time base correcting circuit 20 is constructed by, for example, an FIFO (First-In First-Out) memory. The circuit 20 sequentially writes the sampled value q supplied from the A/D converter 5 at the timing of the reproduction clock signal e, sequentially reads the written sampled value at a timing of a clock signal obtained by frequency dividing the reference clock signal by a frequency dividing circuit 8b, and supplies the read value to the Viterbi decoder 30. A time base fluctuation component in association with the rotation of the recording disk 3 is eliminated by the operation of the time base correcting circuit 20. The Viterbi decoder 30 handles the sampled value q whose time base was corrected by the time base correcting circuit 20 as a continuous time sequence and obtains reproduced data which seems to be certain on the basis of the time sequence.

The PLL circuit 40 is constructed by a phase detecting circuit 41, a digital filter 42, a digital VCO 43, a D/A converter 44, an LPF 45, and a comparator 46.

Figure 3:
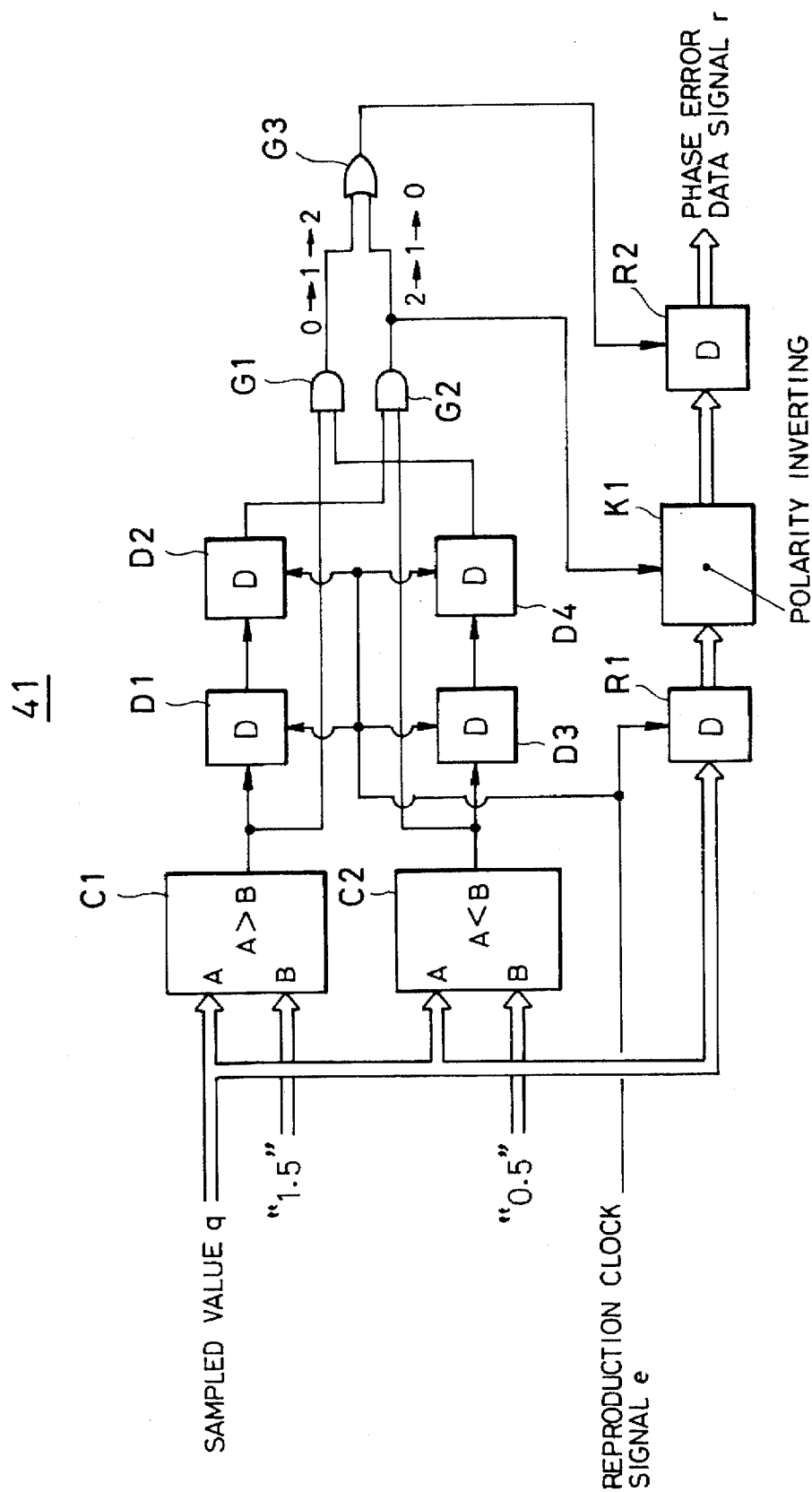
FIG. 3 is a diagram showing a specific construction of a phase detecting circuit in the apparatus of FIG. 2.

FIG. 3 is a diagram showing an internal construction of the phase detecting circuit 41.

In FIG. 3, a comparator C1 judges whether the sampled value q supplied from the A/D converter 5 is equal to or larger than "1.5" or not. When it is judged that the sampled value q is equal to or larger than "1.5", it is regarded that the sampled value q corresponds to "2". The comparator C1 supplies a signal of a logic value "1" to each of a D latch D1 and an AND gate G1. When it is judged that the sampled value q is smaller than "1.5", the comparator C1 supplies a signal of a logic value "0" to each of the D latch D1 and the AND gate G1. The D latch D1 fetches the signal supplied from the comparator C1 at a timing of the reproduction clock signal e and supplies it to a D latch D2 located at the next stage. The D latch D2 fetches the signal supplied from the D latch D1 at a timing of the reproduction clock signal e and supplies it to an AND gate G2.

The comparator C2 judges whether the sampled value q supplied from the A/D converter 5 is smaller than "0.5" or not. When it is judged that the sampled value q is smaller than "0.5", it is regarded that the sampled value q corresponds to "0". The comparator C2 supplies a signal of a logic value "1" to each of a D latch D3 and the AND gate G2. When it is judged that the sampled value q is equal to or larger than "0.5", the comparator C2 supplies a signal of a logic value "0" to each of the D latch D3 and the AND gate G2. The D latch D3 fetches the signal supplied from the comparator C2 at a timing of the reproduction clock signal e and supplies it to a D latch D4 located at the next stage. The D latch D4 fetches the signal supplied from the D latch D3 at a timing of the reproduction clock signal e and supplies it to the AND gate G1.

When both of the logic values of the signals supplied from the comparator C1 and D latch D4 are equal to "1", the AND gate G1 supplies a signal of the logic value "1" to an OR gate G3. When the logic value of either one of the signals supplied from the comparator C1 and D latch D4 is equal to "0", the AND gate G1 supplies a signal of a logic value "0" to the OR gate G3. When both of the logic values of the signals supplied from the comparator C2 and D latch D2 are equal to "1", the AND gate G2 supplies a signal of a logic value "1" to each of a polarity inverting circuit K1 and the OR gate G3. When the logic value of either one of the signals supplied from the comparator C2 and D latch D2 is equal to "0", the AND gate G2 supplies a signal of a logic value "0" to the OR gate G3.

A D latch R1 fetches the sampled value q supplied from the A/D converter 5 at a timing of the reproduction clock signal e and supplies it to the polarity inverting circuit K1. When the signal of the logic value "0" is supplied from the AND Gate G2, the polarity inverting circuit K1 outputs as it is and supplies the sampled value supplied from the D latch R1 to a D latch R2 at the next stage. When the signal of the logic value "1" is supplied from the AND gate G2, the value obtained by inverting the positive or negative polarity of the sampled value supplied from the D latch R1 is supplied to the D latch R2. When the signal of the logic value "1" is supplied from either one of the AND Gates G1 and G2 is supplied, the OR Gate G3 supplies a signal of a logic value "1" to the D latch R2. When the signals of the logic value "0" are supplied from both of the AND Gates G1 and G2, the signal of the logic value "0" is supplied to the D latch R2. When the signal of the logic value "1" is supplied from the OR Gate G3, the D latch R2 fetches the sampled value supplied from the polarity inverting circuit K1 and supplies it as a phase error data signal r to the digital filter 42.

In the phase detecting circuit 41, the intermediate time point of a continuous increasing change from "0" to "2" of the sampled value q which is sequentially supplied from the A/D converter 5 is detected by a construction comprising the comparators C1 and C2, D latches D3 and D4, and AND gate G1. The intermediate time point of a continuous decreasing change from "2" to "0" of the sampled value q which is sequentially supplied from the A/D converter 5 is detected by a construction comprising the comparators C1 and C2, D latches D1 and D2, and AND gate G2. Only the sampled values obtained at the intermediate time points of the transition changes are fetched into the D latch R2 and are generated as a phase error data signal r.

Namely, when the sampled value q is continuously increasing from "0" to "2" or is continuously decreasing from "2" to "0", an ideal value of the sampled value that is obtained at the intermediate point of the transition change is equal to "1". When a phase error occurs, however, the sampled value derived at the intermediate point of the transition change is deviated from the ideal value by only an amount of the phase error. Therefore, the sampled value derived at the intermediate point of the continuous increasing or decreasing change corresponds to the phase error.

As for the sampled value obtained at the intermediate point of the continuous increasing change of the sampled value q and the sampled value obtained at the intermediate point of the continuous decreasing change, the polarities for the phase error are inverted. In the phase detecting circuit 41, therefore, the polarity of only the sampled value derived at the intermediate point of the continuous decreasing change is inverted by the polarity inverting circuit K1.

As mentioned above, on the basis of the sampled value q which is sequentially supplied from the A/D converter 5, the phase detecting circuit 41 with the above construction detects the phase error occurring in the read signal and supplies the phase error data signal r corresponding to the phase error to the digital filter 42.

Figure 4:
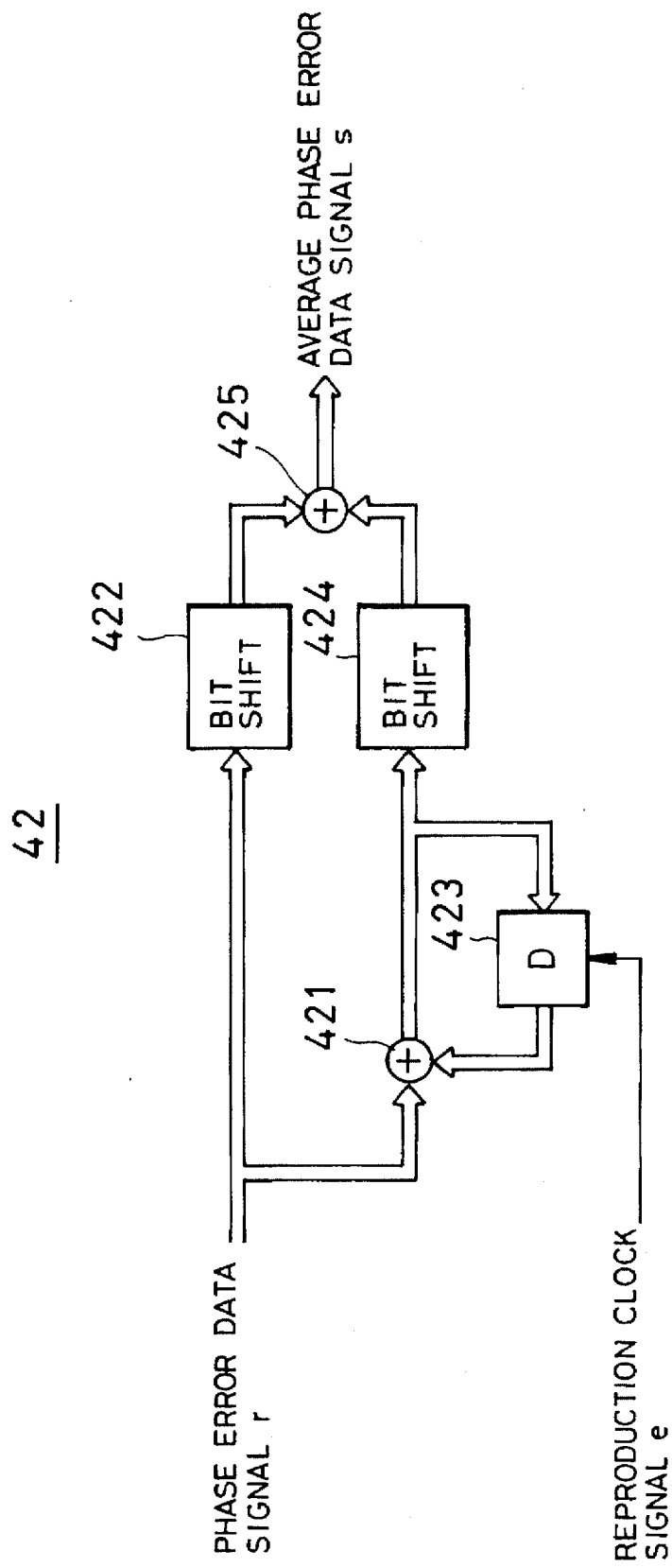
FIG. 4 is a diagram showing a specific construction of a digital filter in the apparatus of FIG. 2.

FIG. 4 is a diagram showing an internal construction of the digital filter 42.

In FIG. 4, the phase error data signal r is supplied to each of an adder 421 and a bit shift circuit 422. The bit shift circuit 422 shifts all data bits of the phase error data signal r by only a predetermined number of bits, thereby adjusting a magnitude of the data value indicated by the phase error data signal r and supplies a phase error proportional data signal of a magnitude that is proportional to the phase error data signal r to an adder 425. The adder 421 adds the phase error data signal r and the data signal supplied from a D latch 423, thereby obtaining an addition result as an integration element of the phase error. A phase error integration data signal corresponding to the integration element of the phase error is supplied to a bit shift circuit 424. The D latch 423 fetches the phase error integration data signal at a timing of the reproduction clock signal e and supplies it as a data signal to the adder 421. The bit shift circuit 424 shifts all data bits of the phase error integration data signal by only a predetermined number of bits, thereby adjusting a magnitude of the data value shown by the phase error integration data signal. The adjusted phase error integration data signal is supplied to the adder 425. The adder 425 adds the phase error proportional data signal supplied from the bit shift circuit 422 and the phase error integration data signal supplied from the bit shift circuit 424, thereby obtaining an addition result as an average phase error data signal s and supplying to the digital VCO 43.

That is, the digital filter 42 with the construction functions as what is called a low pass filter for obtaining an average of the phase error data signals r and setting it to the average phase error data signal s.

Figure 5:
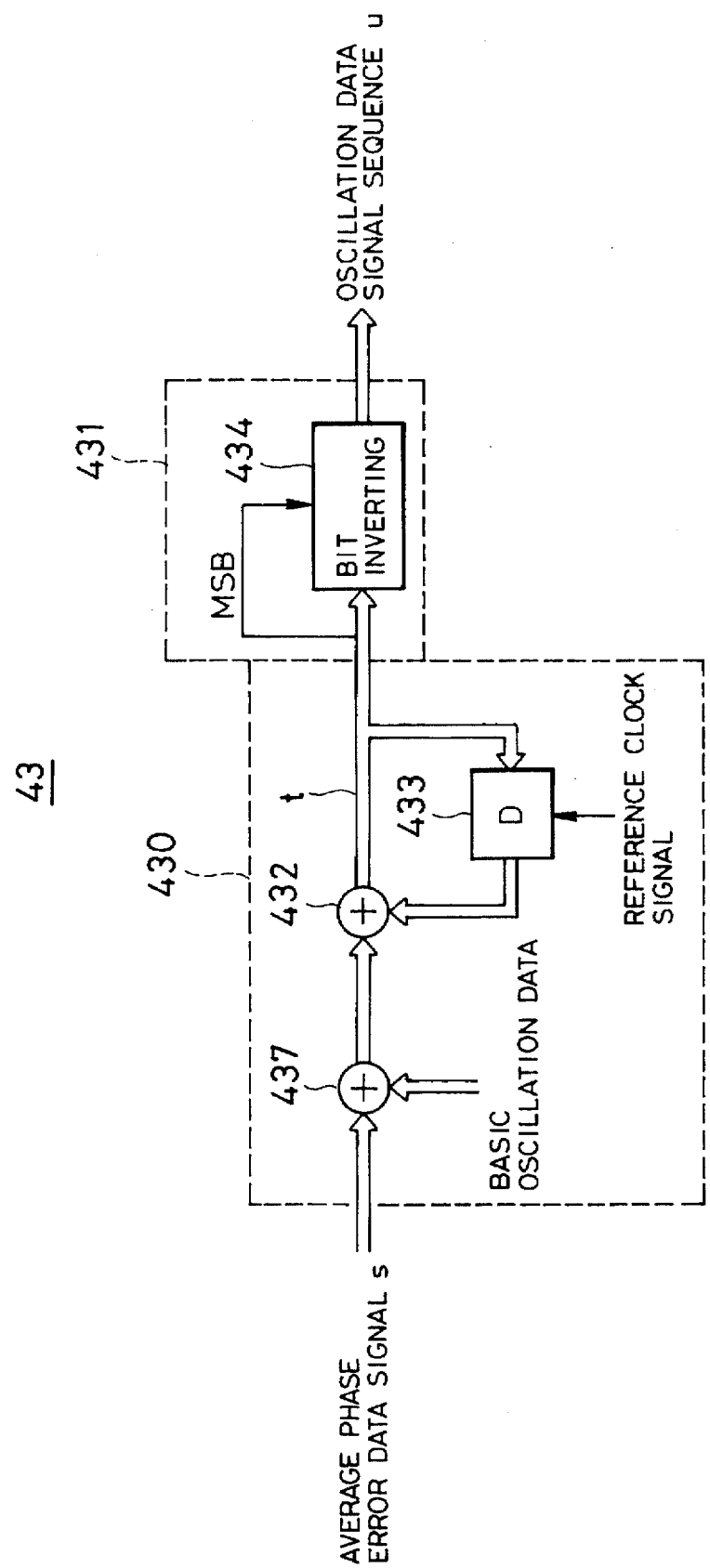
FIG. 5 is a diagram showing a specific construction of a digital VCO in the apparatus of FIG. 2.

FIG. 5 is a diagram showing an internal construction of the digital VCO 43.

As shown in FIG. 5, the digital VCO 43 is constructed by an oscillation data generating section 430 and a waveform converting section 431. In FIG. 5, an adder 437 in the oscillation data generating section 430 successively adds the value of the average phase error data signal s that is sequentially supplied from the digital filter 42 and basic oscillation data as a fixed value and supplies the addition result as oscillating frequency data to an adder 432. The adder 432 and a D latch 433 accumulate the value of the oscillating frequency data at every timing of the reference clock signal supplied from the reference clock generating circuit 9 and supply the accumulation result as an accumulated value t to the waveform converting section 431.

Figure 6:
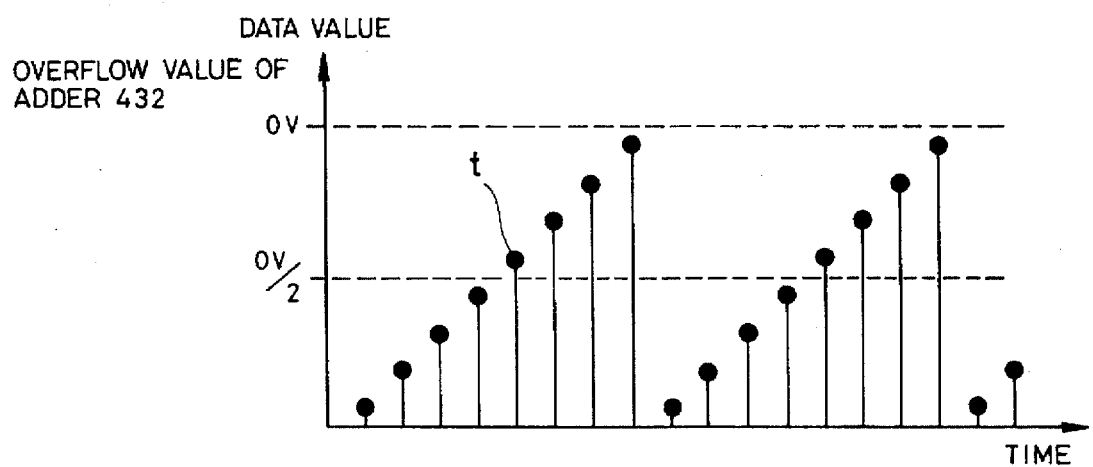
FIG. 6 is a diagram showing a time change in accumulated addition value which is obtained in an oscillation data generating section.

FIG. 6 is a diagram showing a time change of the accumulated value t that is obtained by the oscillation data generating section 430.

As shown in FIG. 6, the accumulated value t linearly increases by the value of the oscillating frequency data at every timing of the reference clock signal. When the accumulated value t exceeds an overflow value OV of the adder 432, the accumulated value t is returned to a small value and again increases from the small value by the value of the oscillating frequency data at a time. By repeatedly executing the operations, a data signal sequence which changes like a saw-tooth as shown in FIG. 6 is formed. Namely, the oscillation data generating section 430 generates the saw-tooth data signal sequence as shown in FIG. 6 by using the overflow oscillation by the adder 432. A period of the data signal sequence which changes like a saw-tooth corresponds to the value of the oscillating frequency data. Namely, when the value of the oscillating frequency data is relatively small, the number of accumulating times which are executed until the accumulated value t exceeds the overflow value OV of the adder 432 is large, so that a period of the data signal sequence also increases. When the value of the oscillating frequency data is relatively large, on the contrary, the number of accumulating times which are executed until the accumulated value t exceeds the overflow value OV is small, so that the period of the data signal sequence also decreases.

The basic oscillation data is used for a basic oscillating operation of the digital VCO 43. For example, when the value of the average phase error data signal s is equal to 0, the data value of the data signal sequence increases or decreases at a fixed period according to the basic oscillation data.

As mentioned above, the oscillation data generating section 430 generates a data signal sequence whose accumulated value t changes like a saw-tooth with a period that is determined by the oscillating frequency data which increases or decreases in accordance with the average phase error data signal s and supplies it to the waveform converting section 431.

The waveform converting section 431 is constructed by a bit inverting circuit 434 as waveform converting means. When the MSB, namely, the most significant bit of the accumulated value t supplied from the oscillation data generating section 430 is equal to a logic value "0", the bit inverting circuit 434 relays and supplies the accumulated value t as it is to the D/A converter 44 located at the next stage. When the MSB of the accumulated value t is equal to a logic value "1", the value obtained by inverting all of the bits of the accumulated value t is supplied to the D/A converter 44 at the next stage. Namely, until the accumulated value t exceeds ½ of the overflow value OV of the adder 432, a data sequence using the accumulated value t, as it is, is supplied as an oscillation data signal sequence u to the D/A converter 44. When the accumulated value t exceeds ½ of the overflow value OV, a data sequence using the value obtained by inverting all of the bits of the accumulated value t is supplied as an oscillation data signal sequence u to the D/A converter 44.

For example, when the overflow value OV of the adder 432 is equal to {1, 1, 1, 1}, so long as the accumulated value t of {0, 1, 1, 1} in which the logic value of the MSB in the 4-bit data is equal to "0" is supplied, the data value having {0, 1, 1, 1} is used as it is as a data signal in the oscillation data signal sequence u. On the other hand, when the accumulated value t having {1, 0, 0, 0} in which the MSB in the 4-bit data is equal to a logic value "1" is supplied, a data value of {0, 1, 1, 1} in which the bit logic of all of the four bits are inverted is used as a data signal in the oscillation data signal sequence u.

Figure 7:
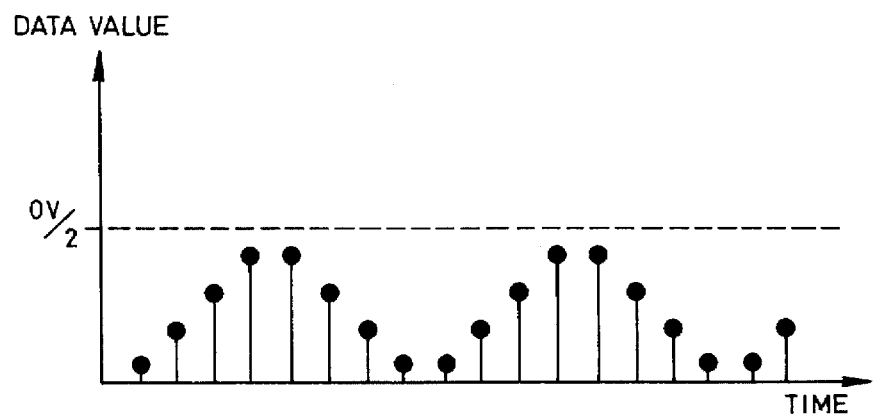
FIG. 7 is a diagram Showing a form of an oscillation data signal sequence which is obtained by a bit inverting circuit.

FIG. 7 is a diagram showing a form of the oscillation data signal sequence u which is obtained by the operation of the bit inverting circuit 434.

As shown in FIG. 7, the data signal sequence which is generated from the oscillation data generating section 430 and changes like a saw-tooth as shown in FIG. 6 is converted to the oscillation data signal sequence u which changes like a triangular wave without changing a frequency. That is, according to the digital VCO 43 shown in FIG. 5, a triangular wave signal having a frequency according to the value of the average phase error data signal s supplied from the digital filter 42 is derived.

In the digital VCO 43 shown in FIG. 5, the oscillation data signal sequence which changes like a triangular wave is produced as an oscillation data signal sequence u. An oscillation data signal sequence which changes like a sine wave, however, can be also generated as an oscillation data sequence u.

Figure 9:
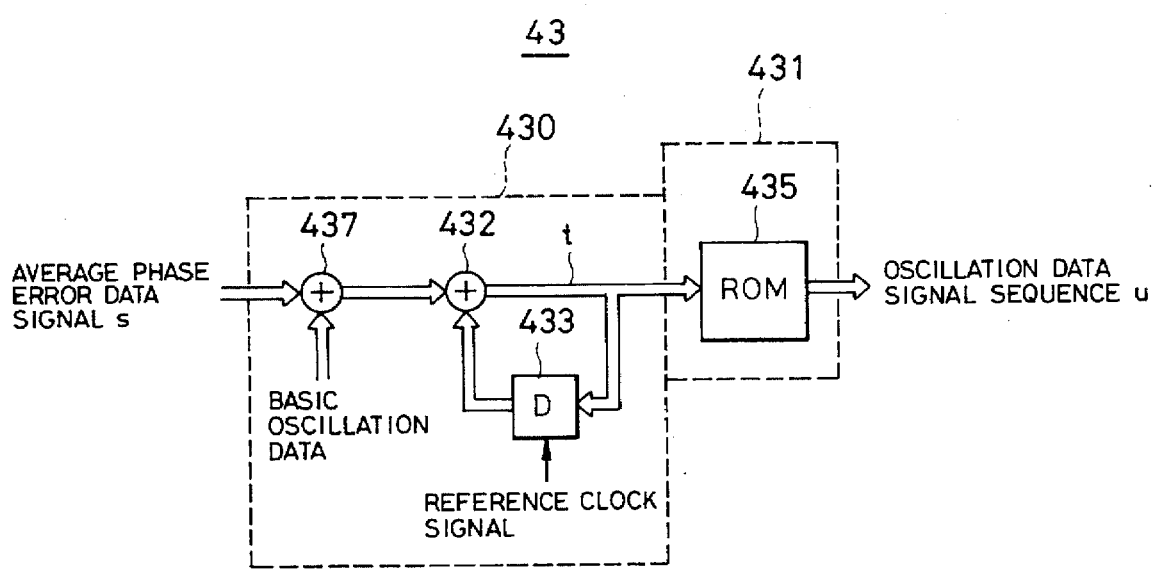
FIG. 9 is a diagram showing a specific construction as another example of the digital VCO in the apparatus of FIG. 2.

FIG. 9 is a diagram showing another embodiment of the digital VCO 43 for generating an oscillation data signal sequence which changes like a sine wave as an oscillation data sequence u.

Although the digital VCO 43 shown in FIG. 9 is the same as that shown in FIG. 5 with respect to the oscillation data generating section 430, it differs from FIG. 5 with regard to a point that a ROM (read only memory) 435 in which a sine wave converting function has been stored is used in the waveform converting section 431.

Figure 10:
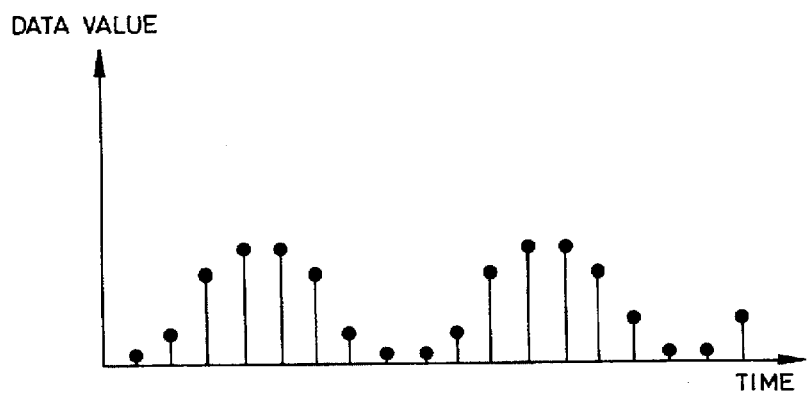
FIG. 10 is a diagram showing a form of the oscillation data signal sequence which is obtained by a ROM in the VCO in FIG. 9.

In the ROM 435, each accumulated value t as shown in FIG. 6 which is sequentially supplied from the oscillation data generating section 430 is used as an address input and a data train which changes like a sine wave as shown in FIG. 10 is read in accordance with the address input. Namely, according to the digital VCO 43 shown in FIG. 9, a sine waveform signal having a period that is determined by the oscillating frequency data which increases or decreases in accordance with the value of the average phase error data signal s supplied from the digital filter 42 is derived.

By the waveform converting section 431 comprising the bit inverting circuit 434 or ROM 435, the saw-tooth waveform as shown in FIG. 6 generated from the oscillation data generating section 430 is converted to the triangular waveform or sine waveform whose data value increases or decreases.

An effect of the waveform converting section 431 will now be described.

Figure 11:
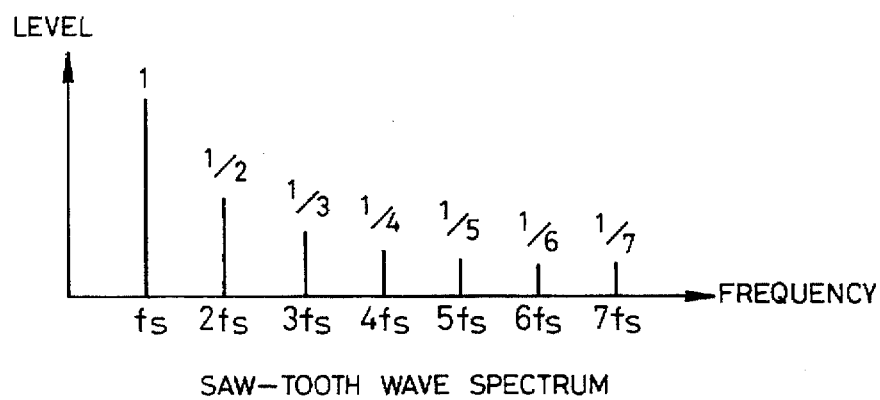
FIG. 11 is a diagram showing a spectrum of a saw-tooth wave.
Figure 12:
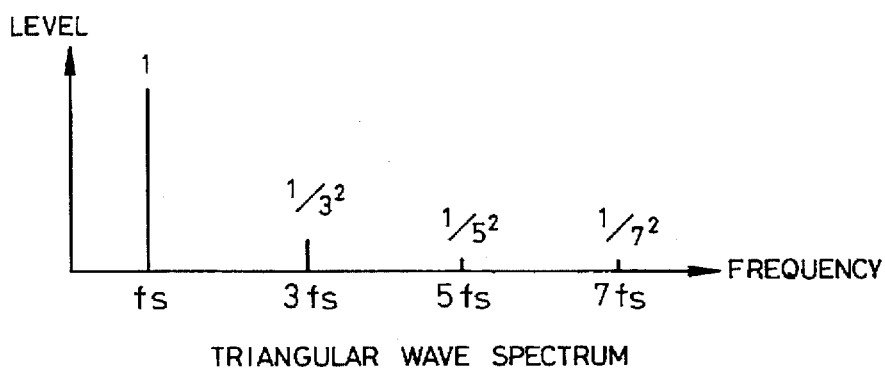
FIG. 12 is a diagram showing a spectrum of a triangular wave.
Figure 13:
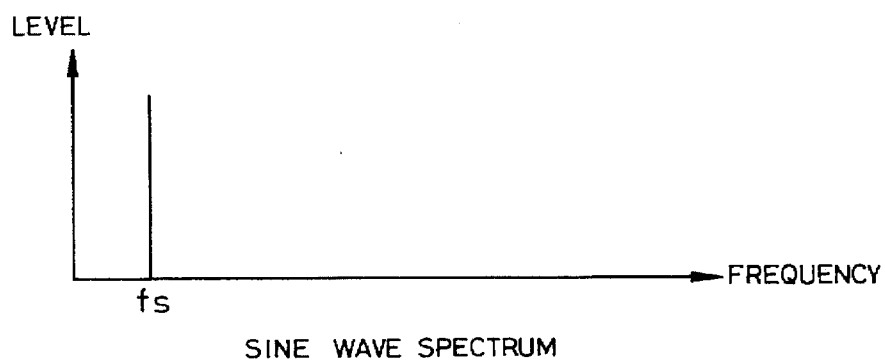
FIG. 13 is a diagram showing a spectrum of a sine wave.

FIG. 11 is a diagram showing a spectrum of a saw-tooth wave. FIG. 12 is a diagram showing a spectrum of a triangular wave. FIG. 13 is a diagram showing a spectrum of a sine wave.

As shown in FIG. 11, many harmonics components are included in the saw-tooth wave and a level of the k-th order harmonics is equal to 1/k of a basic wave fs. As shown in FIG. 12, on the other hand, only odd-number order harmonics are included in the triangular wave and a level of the k-th order harmonics is equal to $1/k^2$ of the basic wave fs. As shown in FIG. 13, the sine wave includes only the basic wave fs and doesn't include any harmonics component.

On the other hand, since data trains which change to a saw-tooth wave, a triangular wave, and sine wave shown in FIGS. 6, 7, and 10 are the same as those obtained by sampling the saw-tooth wave, triangular wave, and sine wave, spectra of those data trains correspond to the spectra in which the spectra of the original waveforms are folded. The number and the level of aliasing components in the spectra of the data trains correspond to the number and the level of harmonics of the original waveform.

Figure 8A:
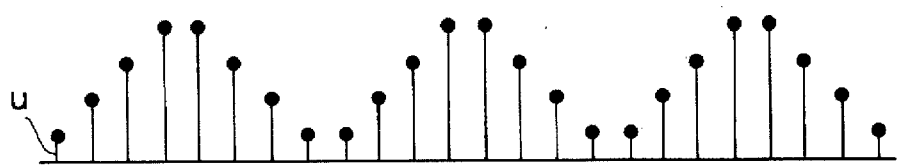
FIGS. 8A to 8D are diagrams each showing the operation of each section in the digital PLL circuit.
Figure 8B:
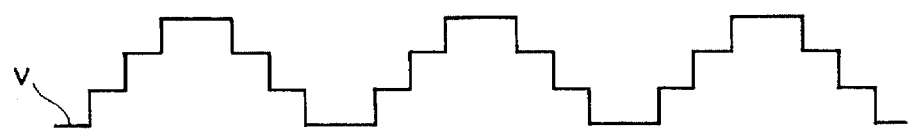

The D/A converter 44 converts the oscillation data signal sequence u as shown in FIG. 8A as such a data train to the analog signal and obtains a stairway-like oscillation signal v as shown in FIG. 8B and supplies it to the LPF 45. The spectrum of the stairway-like oscillation signal v also includes aliasing components by the folding.

Figure 14:
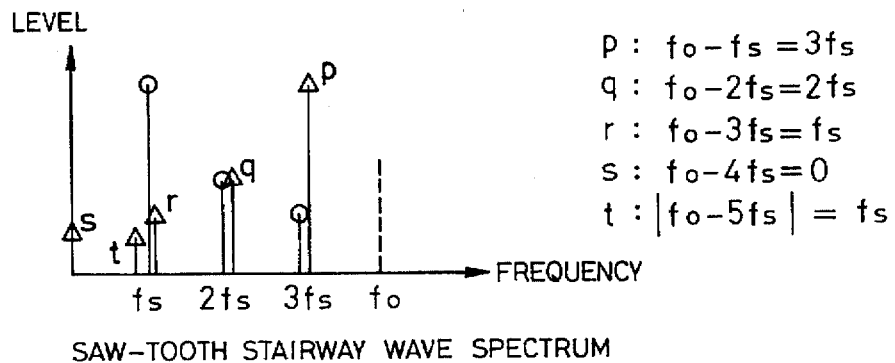
FIG. 14 is a diagram showing a spectrum of an oscillation signal which is obtained when a saw-tooth wave data train is D/A converted.

For example, FIG. 14 is a diagram showing a spectrum of the stairway-like oscillation signal v which is obtained when the saw-tooth data train is converted. It is possible to confirm that aliasing components at a high level occurs on a sampling clock frequency fs and frequencies near it of the oscillation signal v.

Figure 15:
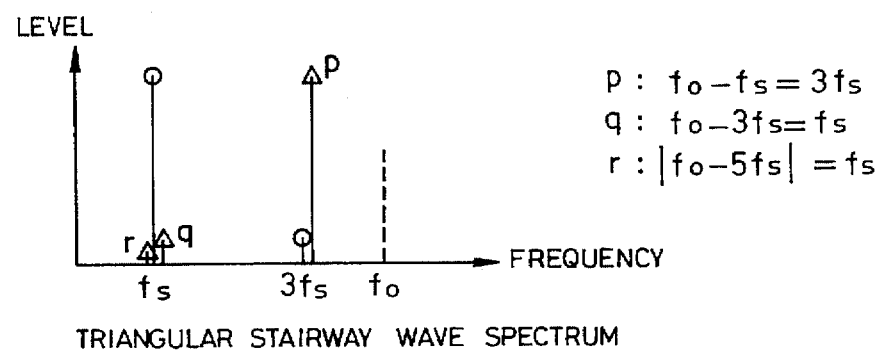
FIG. 15 is a diagram showing a spectrum of the oscillation signal which is obtained when a triangular data train is D/A converted.

FIG. 15 is a diagram showing a spectrum of the stairway-like oscillation signal v which is obtained when the triangular wave data train is converted.

Figure 16:
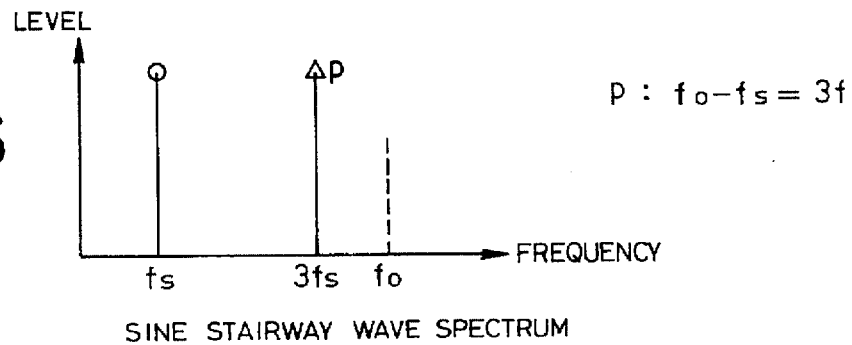
FIG. 16 is a diagram showing a spectrum of the oscillation signal which is obtained when a sine wave data train is D/A converted.

FIG. 16 is a diagram showing a spectrum of the stairway-like oscillation signal v that is obtained when the sine wave data train is converted. It is possible to confirm that no aliasing component occurs on the sampling clock frequency fs and frequencies near it of the oscillation signal v.

Namely, since the number and the level of aliasing components in the spectrum of the data train is suppressed due to a waveform converting function of the waveform converting section 431, the aliasing components in the spectrum of the stairway-like oscillation signal v obtained by converting it are also reduced.

Assuming that many aliasing components occur in the oscillation signal v as shown in FIG. 14, a jitter occurs in the reproduction clock signal e, which will be explained hereinlater, and a reproducing function deteriorates. In the digital VCO 43, however, the saw-tooth waveform signal as shown in FIG. 6 generated by the oscillation data generating section 430 is converted to the triangular waveform signal or sine waveform signal with relatively small harmonics components and, after that, the resultant signal is supplied to the D/A converter 44. The aliasing components, therefore, on the oscillation signal v derived from the D/A converter 44 are reduced, so that the jitter occurring in the reproduction clock signal e can be reduced.

Figure 8C:
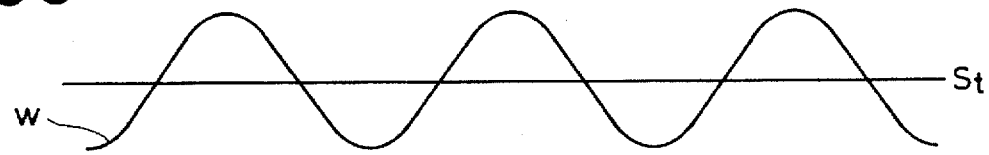
Figure 8D:
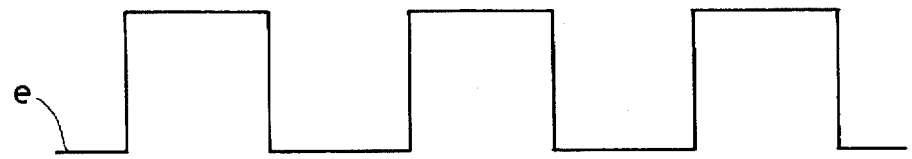

The LPF 45 extracts the sampling clock frequency component from the stairway-like oscillation signal v and obtains a sine wave signal w as shown in FIG. 8C and supplies it to the comparator 46. The comparator 46 compares a signal level of the sine wave signal w and a level of a predetermined threshold value St. When the signal level of the sine wave signal w is larger than the predetermined threshold value St, the reproduction clock signal e as shown in FIG. 8D comprising a high level signal corresponding to the logic value "1" is obtained. When the signal level of the sine wave signal w is equal to or smaller than the predetermined threshold value St, the reproduction clock signal e as shown in FIG. 8D comprising a low level signal corresponding to the logic value "0" is obtained. The reproduction clock signal e obtained is supplied to each of the A/D converter 5, time base correcting circuit 20, phase detecting circuit 41, and digital filter 42.

Namely, the stairway-like oscillation signal v is converted to the square wave signal by the clock signal generating circuit comprising the LPF 45 and comparator 46. The square wave signal is generated as a reproduction clock signal e as shown in FIG. 8D.

As mentioned above, in the digital PLL circuit according to the invention, the read signal read from the recording medium is A/D converted to the digital signal at the sampling timing corresponding to the reproduction clock signal, the phase error occurring in the read signal is detected on the basis of the resultant sampled value, the oscillation data signal sequence whose data value increases or decreases at the period corresponding to the phase error is generated, the oscillation data signal sequence is converted to the analog signal, the resultant oscillation signal is converted to the square wave signal, and the square wave signal is derived as a reproduction clock signal mentioned above.

Namely, in the digital PLL circuit, the reproduction clock signal having the oscillating period corresponding to the phase error is obtained by using the VCO with the digital construction such that the oscillation data signal sequence whose data value increases or decreases at the period corresponding to the phase error is generated.

According to the invention, therefore, the reproduction clock signal which is accurately synchronized with the phase of the read signal can be obtained by the stable loop characteristics without being influenced by the fluctuation of the power source voltage, ambient temperature, aging change in the characteristics, or the like. Since the digital type of VCO is used, there is no need to adjust the oscillating frequency.

What is claimed is:

1. A digital PLL (Phase Locked Loop) circuit in a recording information reproducing apparatus having an A/D converter for sampling a read signal read from a recording medium at a timing according to a reproduction clock signal, thereby sequentially obtaining the sampled value, and decoding means for obtaining reproduction data on the basis of said sampled value, comprising:

phase detecting means for obtaining a phase error data signal corresponding to a phase error occurring in said read signal on the basis of said sampled value;

a digital VCO (Voltage Controlled Oscillator) for generating an oscillation data signal sequence whose period changes in accordance with said phase error data signal;

a D/A converter for converting said oscillation data signal sequence into an analog signal, thereby obtaining an oscillation signal; and clock signal forming means for obtaining a signal obtained by converting a signal waveform of said oscillation signal to a square wave as said reproduction clock signal.

2. A circuit according to claim 1, wherein said digital VCO includes:

oscillation data generating means for obtaining a data signal sequence which changes like a saw tooth by using an accumulated value obtained by accumulating oscillating frequency data obtained by adding said phase error data signal which is supplied from said phase detecting means and basic oscillation data; and waveform converting means for converting said data signal sequence which changes like a saw tooth into a data signal sequence which changes like a triangular wave, thereby obtaining said data signal sequence as said oscillation data signal sequence.

3. A circuit according to claim 2, wherein said waveform converting means comprises bit inverting means for obtaining said oscillation data signal sequence by using said accumulated value when said accumulated value is equal to or smaller than ½ of an overflow value and for obtaining said oscillation data signal sequence by using a value obtained by inverting all bits of said accumulated value when said accumulated value is larger than ½ of said overflow value.

4. A circuit according to claim 3, wherein said bit inverting means obtains said oscillation data signal sequence by using said accumulated value when the most significant bit of said accumulated value is set to a logic value "0", and said bit inverting means obtains said oscillation data signal sequence by using a value obtained by inverting all bits of said accumulated value when the most significant bit of said accumulated value is set to a logic value "1".

5. A circuit according to claim 1, wherein said digital VCO includes:

oscillation data generating means for obtaining a data signal sequence which changes like a saw tooth by using an accumulated value obtained by accumulating oscillating frequency data obtained by adding said phase error data signal which is supplied from said phase detecting means and basic oscillation data; and waveform converting means for converting said data signal sequence which changes like a saw tooth into a data signal sequence which changes like a sine wave and using said data signal sequence as said oscillation data signal sequence.

6. A circuit according to claim 5, wherein said waveform converting means is a ROM (Read Only Memory) in which a sine wave converting function has been stored.

* * * * *